United States Patent [19]

Gurnee

[11] 4,446,372

[45] May 1, 1984

[54] DETECTOR COLD SHIELD

[75] Inventor: Mark N. Gurnee, Framingham, Mass.

[73] Assignee: Honeywell Inc., Minneapolis, Minn.

[21] Appl. No.: 279,297

[22] Filed: Jul. 1, 1981

[51] Int. Cl.³ .......................... H01J 31/49; G01J 1/00
[52] U.S. Cl. .................................. 250/334; 250/349; 250/352
[58] Field of Search ............... 250/332, 334, 338, 349, 250/352, 370; 356/416, 419; 357/32

[56] References Cited

U.S. PATENT DOCUMENTS

| | | | |
|---|---|---|---|
| 3,929,398 | 12/1975 | Bates | 356/416 |
| 3,963,926 | 6/1976 | Borrello . | |
| 4,039,833 | 8/1977 | Thom | 250/332 |
| 4,078,243 | 3/1978 | De Bar et al. | 357/32 |
| 4,253,022 | 2/1981 | Allen et al. | 250/349 |

OTHER PUBLICATIONS

William J. White Application for Etchable Glass Cold Shield for Background Limited Detectors, Serial No. 248,127 filed 3/27/81.

*Primary Examiner*—Janice A. Howell
*Attorney, Agent, or Firm*—John P. Sumner

[57] ABSTRACT

A shield for limiting the radiation received by electromagnetic energy radiation detectors to the radiation provided to the detectors by the optics of an electromagnetic energy detection system. The shield comprises a member transparent to a predetermined spectrum of radiation. An opaque thin film is deposited on a surface of the member, the thin film having apertures defined therein, the detectors viewing the optics through the member and the apertures. The thin film shields the detectors from electromagnetic radiation generated outside the field of view of the optics, thereby improving the sensitivity of the detection system. Virtually any desired thickness for the member may be used, thus allowing very close placement of the shield to the detectors and permitting use of very high density arrays.

68 Claims, 5 Drawing Figures

DETECTOR COLD SHIELD

BACKGROUND OF THE INVENTION

The present invention relates to shielding undesirable background electromagnetic radiation from radiation detectors. Such shielding is particularly applicable to infrared detectors and systems. However, shields in accordance with the present invention are equally applicable to other detector systems in which it is desirable to shield background radiation in the spectral or electromagnetic energy band of the system detectors.

With background limited infrared detectors, individual detector sensitivity or figure of merit is generally recognized to be inversely proportional to the square root of background radiation. Therefore, it is desirable to limit detector background so that each detector in an array sees only the applicable optics of the infrared system.

Lowering background radiation by shielding at the optics is cumbersome and adds weight or complexity to the system. Accordingly, shielding at the detector has long been recognized as an effective and workable approach to limiting background radiation. In the past, individual detector elements have been shielded by a variety of means. In the instance of a linear array of detectors, a slotted type of shield has often been used. In this configuration, parallel strips of metal or other reflective material have been mounted on the detector substrate or in the dewar parallel to the detector array in order to limit a certain amount of stray energy from striking the detector from sources other than the collection optics of the system. These systems have the disadvantage that they only reject stray energy in one direction, perpendicular to the linear array. In addition, if the mask is placed anywhere other than on the detector substrate, stray energy may be reflected off internal surfaces of the system onto the detector array, further reducing the efficiency of the shield.

In one prior art cold shield design, described in U.S. Pat. No. 3,963,926, S. R. Borrello, "Detector Cold Shield" (hereinafter Borrello) bulk silicon is adhered to a detector substrate, and individual holes corresponding to each detector element are created in the material by an etching process. The walls of the holes and the three-dimensional bulk of the material mask serve to help restrict the field of view of each detector to the cone of energy focused by the collection optics.

With the Borrello design, the sides of the holes must necessarily extend far above the detector surface through the mask material bulk, which is necessary to provide mechanical support for the array mask or cold shield structure. In a low f-number optical system, where the cone of energy focused by the collection optics is relatively broad, it may be impossible to properly shield the detectors while providing the necessary mechanical rigidity, since the walls of the mask material may occlude the desired optical beam if the material is too thick.

A still further disadvantage of the Borrello shield relates to the fact that, because of the directionality of preferential etching in silicon, it is impossible to match the configuration of the cold shield apertures with the configuration of conventional detectors, thus reducing shielding efficiency. Another disadvantage of the cold shield disclosed in Borrello is that the preferential etching of silicon may lead to a coalescing of etched holes in closely spaced detector arrays, which may mechanically weaken the structure. These disadvantages are thoroughly discussed in U.S. application Ser. No. 248,127 W. J. White, "Etchable Glass Cold Shield for Background Limited Detectors", filed March 27, 1981 (hereinafter White). The cold shield disclosed in the White application overcomes these problems and in addition provides other advantages discussed in the application.

The shield disclosed in White comprises a member of etchable glass having apertures formed therein, the position of the aperture edges being in predetermined relation to edges of detectors within an electromagnetic radiation detection system. The shield is employed to shield the detectors from electromagnetic radiation generated outside the field of view of the system optics, thereby increasing the sensitivity of the system.

Although the White shield provides many advantages over that disclosed in Borrello, the present application has additional particular advantages. The present invention allows a very thin cold shield to be placed very closely to the detectors, such as directly on or within the substrate that is supporting backside illuminated detectors. As explained further below, this permits cold shielding a very high density array of detectors.

Further, the present invention uses an opaque absorber or reflector, such as a thin film, which is much easier to pattern than trying to etch holes in a physical member.

In addition, the present invention allows a one piece structure, allowing one to get the detector array and cold shield all in one piece, so that one does not have to be mounted to the other. Such a structure provides a higher yield process.

Although it would be possible to take either the Borrello or the White cold shield and mount it to the front surface of a detector array so that back surface detectors would be shielded, such an approach, for a very high density array, would present problems involving the thickness of the shield itself, especially with the Borrello shield (this aspect is thoroughly explained in the White application). When one starts from a detector and goes out toward a source of radiation, there is a certain included angle that energy is being collected within. In a high density array, with closely spaced detectors, or even in an array of not so closely spaced detectors, the farther away from the detectors one gets, the more the included angles start to overlap. As soon as they overlap, a physical structure cannot be used for the cold shield since there would then be overlapping holes, which means there would be no material between the holes.

However, through the present invention, a cold shield can be placed very close to the detectors by, for example, in the case of back surface detectors, providing a thin film directly on to the front surface of the detector array substrate. With this approach, one can get close enough to the detectors with a sufficiently thin material so that the shield apertures do not overlap.

In contrast, if one has to make a physical thing, such as the Borrello or White cold shield, it has to have sufficient thickness to hold itself together. Thus, in a typical modern array, in attempting to use such a shield, one would, in some applications, end up with no structure.

Through the present invention, a cold shield is provided for shielding individual elements of an infrared detector array of closely spaced detector elements, while providing good mechanical rigidity. While the present invention has particular advantages for low f-number optical systems or high density arrays, it is not limited to such systems. Further, the present invention provides, through standard semiconductor processing technology, a means of optimally placing a cold shield mask in predetermined relation to the individual detectors, while eliminating the problem of aligning separate shields and arrays, particularly for backside illuminated detector arrays. Also, as with the White cold shield, cold shield apertures provided by the present invention may be matched in configuration to the configuration of conventional detectors. In addition, the present invention provides a cold shield which is easily and economically manufactured.

SUMMARY OF THE INVENTION

The present invention is a shield for limiting the radiation received by electromagnetic energy radiation detectors to the radiation provided to the detectors by the optics of an electromagnetic energy detection system. The shield comprises a member transparent to a predetermined spectrum of radiation. An opaque thin film is deposited on a surface of the member, the thin film having apertures defined therein, the detectors viewing the optics through the member and the apertures. The thin film shields the detectors from electromagnetic radiation generated outside the field of view of the optics, thereby improving the sensitivity of the detection system. Virtually any desired thickness for the member may be used, thus allowing very close placement of the shield to the detectors and permitting use of very high density arrays.

DESCRIPTION OF THE PREFERRED EMBODIMENTS

Figure 1:
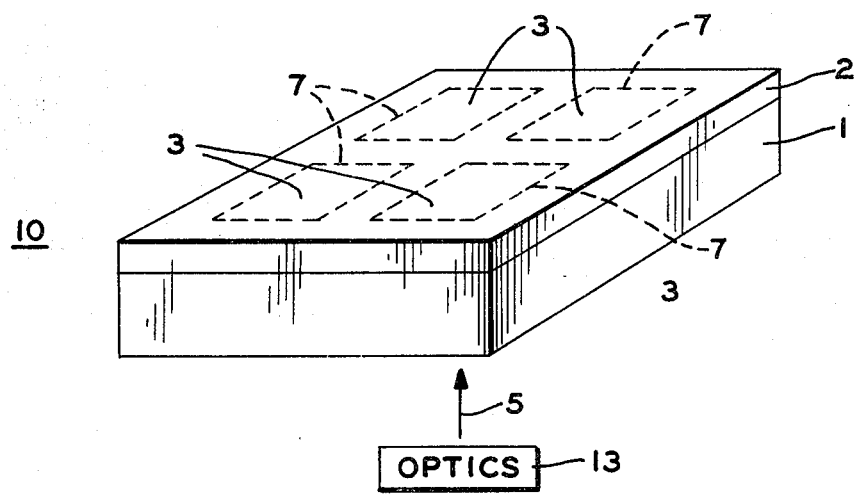
FIG. 1 depicts a prior art electromagnetic energy detector array created by ion implantation in the area of each individual detector element.
Figure 2:
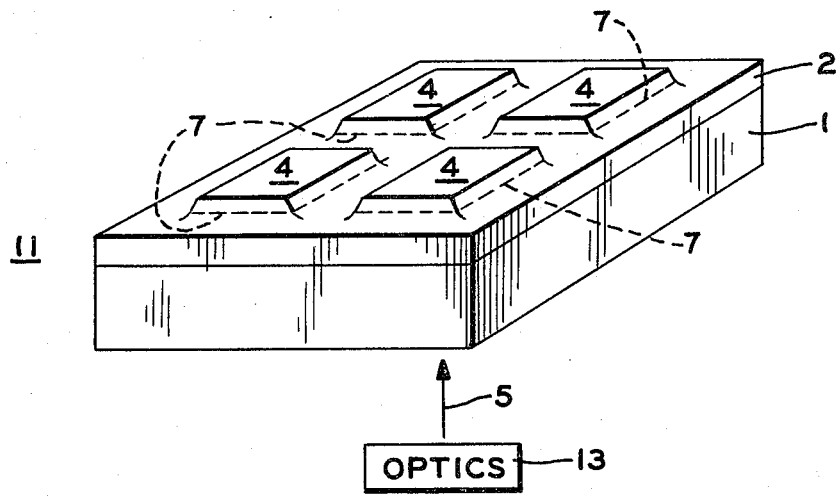
FIG. 2 depicts a prior art electromagnetic energy detector array formed by etching into a growth of a material of one carrier type on a base of opposing carrier type to define individual detectors.

In accordance with the present invention, a backside illuminated detector array such as 10, 11, or 12 is formed on a substrate 1 transparent in the considered waveband. As an example, a layer 2 of narrow bandgap HgCdTe is grown on a substrate 1 of CdTe by liquid phase epitaxy, a process known to those skilled in the art of detector fabrication. Layer 2 of HgCdTe is typically thin compared to the minority carrier diffusion length in the HgCdTe. Photovoltaic detectors such as 3 or 4 are formed on the free surface of the HgCdTe, either by ion implantation (FIG. 1) or growth of a second layer (FIG. 2). For example, as illustrated in FIG. 2, a second layer of HgCdTe of opposite carrier type to layer 2 may be grown, and a detector array may be defined by etching through the second layer of HgCdTe into layer 2. In the arrays illustrated, infrared radiation 5 incident on the CdTe substrate 1 passes through substrate 1 to HgCdTe layer 2 and generates minority carriers which are collected by detector junctions 7 within detectors 3 or 4, junctions 7 being illustrated by the plane of the dashed line structures in FIGS. 1 and 2.

In accordance with one application of the present invention, an opaque thin film 6 of an absorbing or reflecting material is deposited on a surface of substrate 1 opposite to the surface on which detectors 3 or 4 are located. An example of an absorbing material would be $SiO_x$, which absorbs in the 8-12 micron spectral band, such a material being deposited, for example, by evaporation processing well known in the art. Examples of reflective materials for layer 6 are chrome, gold, and chrome-gold. Such materials may be deposited by sputtering through processing well known in the art. An array of apertures 8 is then formed in layer 6 using photolithographic and well known standard etching or lift-off techniques. For example, photoresist may be deposited over a chrome-gold layer 6, the photoresist being exposed and developed to give openings appropriately aligned to detector junctions 7. Chrome-gold layer 6 may then be etched away to form apertures 8, after which the photoresist is removed.

If detector material 2 and substrate 1 with mask or cold shield 6 are fabricated separately, the array of apertures 8 may be aligned to the detector array using an infrared microscope or by similar techniques. In such a case, an adhesive layer 9 may be used to bond substrate 1 to layer 2.

Figure 3A:
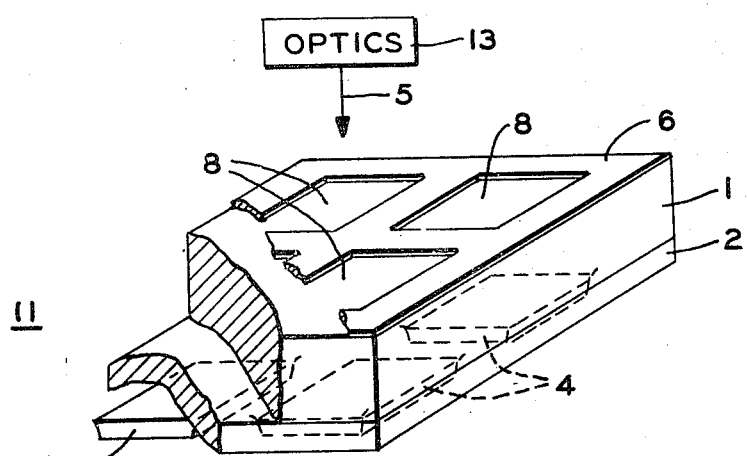
FIG. 3A shows an isometric view of a detector array in accordance with a preferred embodiment of the present invention.
Figure 3B:
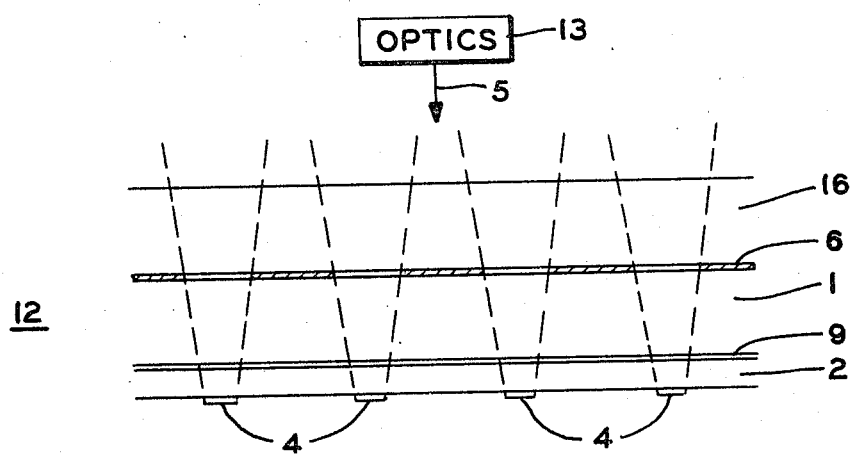
FIG. 3B shows a cross sectional view of an embedded cold shield within a detector array in accordance with an alternate preferred embodiment of the present invention.

Alternately the present invention may take the form of a separate cold shield assembly adapted for use with a detector array, but fabricated separately to be used in the manner of White or Borrello. For example, a member 1 of material transparent to a predetermined spectrum of electromagnetic energy may be coated with an opaque thin film 6 of absorptive or reflective material. After delineating apertures 8 as discussed above, such an assembly can then be adapted to a detector array such as with White or Borrello, the eventual assembly being adapted so that the detectors view the applicable system optics through apertures 8. Such a cold shield could be adapted to back surface detectors as disclosed in the drawings of this application, or in a more conventional sense, with frontside illuminated detectors, as is disclosed in White and Borrello. Note that in applying a separate cold shield made in accordance with the present invention, the cold shield can be placed very close to either front or back surface detectors, since the thickness of layer 1 may be made as thin as desired, reinforcement being added for strength as necessary by sandwiching thin film 6 between a first member or substrate 1 and a second member or substrate 16, as shown by way of example in FIG. 3B.

As previously discussed, therefore, the present invention provides a cold shield of minimum thickness, thus providing an optimum shield for high density arrays and low f-number systems. In this regard, the thickness of thin film 6 is typically in a range of approximately a few tenths of a micron to approximately a few microns. Virtually any desired thickness can be adapted for the member or substrate 1 on which thin film 6 is mounted.

The effectiveness of cold shielding provided by shield 6 is determined in large part by the relative sizes and spacing of the detector junctions 7 and the shield apertures 8. In this regard, as previously mentioned, both the White shield and the present invention have a significant advantage in that apertures 8 may be configured to have the same or substantially the same geometrical configuration when viewed by the system optics as detector junctions 7. As discussed above and in the White application, this is in contrast to the shield disclosed in Borrello, the apertures of which are available only in limited predetermined configurations, since the configuration of apertures etched in silicon are determined, at least in part, by the preferential etch planes of silicon.

Figure 4:
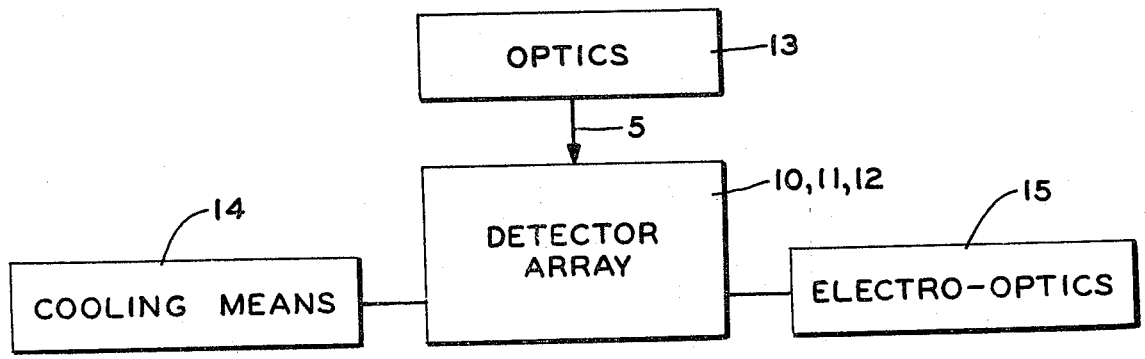
FIG. 4 is a block diagram of a typical infrared or other electromagnetic energy detection system.

A typical infrared system may be described as an electromagnetic radiation detection system. As is illustrated in FIG. 4, such a system normally includes optics 13 for viewing a scene initiating electromagnetic radiation, the optics providing a field of view of the scene (optics 13 could include an optical scanner; alternately, the system could employ staring sensors and would not include an optical scanner). The system also includes an array such as 10, 11, or 12 of electromagnetic radiation detectors mounted in the path of the field of view of the optics for producing electrical signals representative of electromagnetic radiation impinging on the detectors. In accordance with the present invention, the system also includes a shield for limiting the radiation received by the detectors to the radiation provided to the detectors by the optics. The shield comprises a member of material transparent to a predetermined spectrum of radiation. An opaque thin film is deposited on a surface of the member, the thin film having apertures defined therein, the detectors viewing the optics through the member and the apertures. The thin film shields the detectors from electromagnetic radiation generated outside the field of view of the optics, thereby improving the sensitivity of the detector array. A typical system also includes cooling means 14 for cooling the array of detectors and (or including) the shield, and electro-optics 15 coupled to the electrical output of the detector array to form a display of the scene viewed by optics 13.

The present invention is to be limited only in accordance with the scope of the appended claims, since persons skilled in the art may devise other embodiments still within the limits of the claims.

The embodiments of the invention in which an exclusive property or right is claimed are defined as follows:

1. An electromagnetic radiation detection system comprising:
   optics for viewing a scene emanating electromagnetic radiation, the optics providing a field of view of the scene;
   an array of detectors mounted in the path of the field of view of the optics for producing electrical signals representative of the electromagnetic radiation impinging on the detectors;
   a shield comprising a first member transparent to a predetermined spectrum of electromagnetic radiation, there being an opaque thin film deposited on a surface of the member, the thin film having apertures defined therein, the detectors viewing the optics through the member and the apertures, the thin film shielding the detectors from electromagnetic radiation generated outside the field of view of the optics to improve the sensitivity of the detector array;
   cooling means for cooling the array of detectors and the shield; and
   electro-optics coupled to the electrical output of the array for forming a display of the scene viewed by the optics; whereby virtually any desired thickness for the member may be used, thus allowing very close placement of the shield to the detectors and permitting use of very high density arrays.

2. The apparatus of claim 1 wherein:
   the member comprises first semiconductor substrate means having first and second opposing surfaces;
   the detectors are located in spaced relation on the first surface of the first substrate means, each detector being viewed by the optics through the second surface; and
   the opaque thin film is deposited on the second surface of the first substrate means;
   whereby a detector array of backside detectors comprises an integrated cold shield of opaque thin film.

3. The apparatus of claim 2 wherein second substrate means is mounted to the opaque thin film so that the opaque thin film is sandwiched between the first and second substrate means, the second substrate means being transparent to a predetermined spectrum of electromagnetic radiation, whereby the second substrate means provides additional strength to the detector array.

4. The apparatus of claim 3 wherein the thin film has a thickness in the range of approximately a few tenths of a micron to approximately a few microns.

5. The apparatus of claim 4 wherein the detectors as viewed from the optics have a particular geometrical configuration, and wherein the apertures as viewed from the optics have a substantially matching configuration.

6. The apparatus of claim 5 wherein the thin film shields the detectors from electromagnetic radiation by reflecting at least a portion of the electromagnetic radiation generated outside the field of view of the optics.

7. The apparatus of claim 5 wherein the thin film shields the detectors from electromagnetic radiation by absorbing at least a portion of the electromagnetic radiation generated outside the field of view of the optics.

8. The apparatus of claim 6 or 7 wherein each substrate means comprises a semiconductor substrate.

9. The apparatus of claim 8 wherein the detectors are infrared detectors.

10. The apparatus of claim 1 wherein a second member is mounted to the opaque thin film so that the opaque thin film is sandwiched between the first and second members, the second member being transparent to a predetermined spectrum of electromagnetic radiation, whereby the second member provides additional strength to the shield.

11. The apparatus of claim 10 wherein the thin film has a thickness in the range of approximately a few tenths of a micron to approximately a few microns.

12. The apparatus of claim 11 wherein the detectors as viewed from the optics have a particular geometrical configuration, and wherein the apertures as viewed from the optics have a substantially matching configuration.

13. The apparatus of claim 12 wherein the thin film shields the detectors from electromagnetic radiation by reflecting at least a portion of the electromagnetic radiation generated outside the field of view of the optics.

14. The apparatus of claim 12 wherein the thin film shields the detectors from electromagnetic radiation by absorbing at least a portion of the electromagnetic radiation generated outside the field of view of the optics.

15. The apparatus of claim 13 or 14 wherein each member comprises a semiconductor substrate.

16. The apparatus of claim 15 wherein the detectors are infrared detectors.

17. The apparatus of claim 1 wherein the thin film has a thickness in the range of approximately a few tenths of a micron to approximately a few microns.

18. The apparatus of claim 17 wherein the detectors as viewed from the optics have a particular geometrical configuration, and wherein the apertures as viewed from the optics have a substantially matching configuration.

19. The apparatus of claim 18 wherein the thin film shields the detectors from electromagnetic radiation by reflecting at least a portion of the electromagnetic radiation generated outside the field of view of the optics.

20. The apparatus of claim 18 wherein the thin film shields the detectors from electromagnetic radiation by absorbing at least a portion of the electromagnetic radiation generated outside the field of view of the optics.

21. The apparatus of claim 19 or 20 wherein the member comprises a semiconductor substrate.

22. The apparatus of claim 21 wherein the detectors are infrared detectors.

23. The apparatus of claim 1 wherein the detectors as viewed from the optics have a particular geometrical configuration, and wherein the apertures as viewed from the optics have a substantially matching configuration.

24. The apparatus of claim 23 wherein the thin film shields the detectors from electromagnetic radiation by reflecting at least a portion of the electromagnetic radiation generated outside the field of view of the optics.

25. The apparatus of claim 23 wherein the thin film shields the detectors from electromagnetic radiation by absorbing at least a portion of the electromagnetic radiation generated outside the field of view of the optics.

26. The apparatus of claim 24 or 25 wherein the member comprises a semiconductor substrate.

27. The apparatus of claim 26 wherein the detectors are infrared detectors.

28. The apparatus of claim 1 wherein the thin film shields the detectors from electromagnetic radiation by reflecting at least a portion of the electromagnetic radiation generated outside the field of view of the optics.

29. The apparatus of claim 1 wherein the thin film shields the detectors from electromagnetic radiation by absorbing at least a portion of the electromagnetic radiation generated outside the field of view of the optics.

30. The apparatus of claim 28 or 29 wherein the member comprises a semiconductor substrate.

31. The apparatus of claim 30 wherein the detectors are infrared detectors.

32. The apparatus of claim 1 wherein the member comprises a semiconductor substrate.

33. The apparatus of claim 32 wherein the detectors are infrared detectors.

34. The apparatus of claim 1 wherein the detectors are infrared detectors.

35. A shield for limiting the radiation received by electromagnetic energy radiation detectors to the radiation provided to the detectors by the optics of an electromagnetic energy detection system, the shield comprising a first member transparent to a predetermined spectrum of electromagnetic radiation, there being an opaque thin film deposited on a surface of the member, the thin film having apertures defined therein, the detectors viewing the optics through the member and the apertures, the thin film shielding the detectors from electromagnetic radiation generated outside the field of view of the optics, thereby improving the sensitivity of the detector array, whereby virtually any desired thickness for the member may be used, thus allowing very close placement of the shield to the detectors and permitting use of very high density arrays.

36. The apparatus of claim 35 wherein:
the member comprises first semiconductor substrate means having first and second opposing surfaces;
the detectors are located in spaced relation on the first surface of the first substrate means, each detector being viewed by the optics through the second surface; and
the opaque thin film is deposited on the second surface of the first substrate means;
whereby a detector array of backside detectors comprises an integrated cold shield of opaque thin film.

37. The apparatus of claim 36 wherein second substrate means is mounted to the opaque thin film so that the opaque thin film is sandwiched between the first and second substrate means, the second substrate means being transparent to a predetermined spectrum of electromagnetic radiation, whereby the second substrate means provides additional strength to the detector array.

38. The apparatus of claim 37 wherein the thin film has a thickness in the range of approximately a few tenths of a micron to approximately a few microns.

39. The apparatus of claim 38 wherein the detectors as viewed from the optics have a particular geometrical configuration, and wherein the apertures as viewed from the optics have a substantially matching configuration.

40. The apparatus of claim 39 wherein the thin film shields the detectors from electromagnetic radiation by reflecting at least a portion of the electromagnetic radiation generated outside the field of view of the optics.

41. The apparatus of claim 39 wherein the thin film shields the detectors from electromagnetic radiation by absorbing at least a portion of the electromagnetic radiation generated outside the field of view of the optics.

42. The apparatus of claim 40 or 41 wherein each substrate means comprises a semiconductor substrate.

43. The apparatus of claim 42 wherein the detectors are infrared detectors.

44. The apparatus of claim 35 wherein a second member is mounted to the opaque thin film so that the opaque thin film is sandwiched between the first and second members, the second member being transparent to a predetermined spectrum of electromagnetic radiation, whereby the second member provides additional strength to the shield.

45. The apparatus of claim 44 wherein the thin film has a thickness in the range of approximately a few tenths of a micron to approximately a few microns.

46. The apparatus of claim 45 wherein the detectors as viewed from the optics have a particular geometrical configuration, and wherein the apertures as viewed from the optics have a substantially matching configuration.

47. The apparatus of claim 46 wherein the thin film shields the detectors from electromagnetic radiation by reflecting at least a portion of the electromagnetic radiation generated outside the field of view of the optics.

48. The apparatus of claim 46 wherein the thin film shields the detectors from electromagnetic radiation by absorbing at least a portion of the electromagnetic radiation generated outside the field of view of the optics.

49. The apparatus of claim 47 or 48 wherein each member comprises a semiconductor substrate.

50. The apparatus of claim 49 wherein the detectors are infrared detectors.

51. The apparatus of claim 35 wherein the thin film has a thickness in the range of approximately a few tenths of a micron to approximately a few microns.

52. The apparatus of claim 51 wherein the detectors as viewed from the optics have a particular geometrical configuration, and wherein the apertures as viewed from the optics have a substantially matching configuration.

53. The apparatus of claim 52 wherein the thin film shields the detectors from electromagnetic radiation by reflecting at least a portion of the electromagnetic radiation generated outside the field of view of the optics.

54. The apparatus of claim 52 wherein the thin film shields the detectors from electromagnetic radiation by absorbing at least a portion of the electromagnetic radiation generated outside the field of view of the optics.

55. The apparatus of claim 53 or 54 wherein the member comprises a semiconductor substrate.

56. The apparatus of claim 55 wherein the detectors are infrared detectors.

57. The apparatus of claim 35 wherein the detectors as viewed from the optics have a particular geometrical configuration, and wherein the apertures as viewed from the optics have a substantially matching configuration.

58. The apparatus of claim 57 wherein the thin film shields the detectors from electromagnetic radiation by reflecting at least a portion of the electromagnetic radiation generated outside the field of view of the optics.

59. The apparatus of claim 57 wherein the thin film shields the detectors from electromagnetic radiation by absorbing at least a portion of the electromagnetic radiation generated outside the field of view of the optics.

60. The apparatus of claim 58 or 59 wherein the member comprises a semiconductor substrate.

61. The apparatus of claim 60 wherein the detectors are infrared detectors.

62. The apparatus of claim 35 wherein the thin film shields the detectors from electromagnetic radiation by reflecting at least a portion of the electromagnetic radiation generated outside the field of view of the optics.

63. The apparatus of claim 35 wherein the thin film shields the detectors from electromagnetic radiation by absorbing at least a portion of the electromagnetic radiation generated outside the field of view of the optics.

64. The apparatus of claim 62 or 63 wherein the member comprises a semiconductor substrate.

65. The apparatus of claim 64 wherein the detectors are infrared detectors.

66. The apparatus of claim 35 wherein the member comprises a semiconductor substrate.

67. The apparatus of claim 66 wherein the detectors are infrared detectors.

68. The apparatus of claim 35 wherein the detectors are infrared detectors.

* * * * *